(12) United States Patent
Hatsuda

(10) Patent No.: US 10,097,207 B2
(45) Date of Patent: Oct. 9, 2018

(54) ECC CIRCUIT, STORAGE DEVICE AND MEMORY SYSTEM

(71) Applicant: TOSHIBA MEMORY CORPORATION, Minato-ku, Tokyo (JP)

(72) Inventor: Kosuke Hatsuda, Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 49 days.

(21) Appl. No.: 15/261,542

(22) Filed: Sep. 9, 2016

(65) Prior Publication Data

US 2017/0264318 A1    Sep. 14, 2017

Related U.S. Application Data

(60) Provisional application No. 62/306,290, filed on Mar. 10, 2016.

(51) Int. Cl.
   *H03M 13/00* (2006.01)
   *H03M 13/15* (2006.01)

(52) U.S. Cl.
   CPC ..... *H03M 13/1525* (2013.01); *H03M 13/158* (2013.01); *H03M 13/1545* (2013.01); *H03M 13/1575* (2013.01)

(58) Field of Classification Search
   CPC ........... H03M 13/152; H03M 13/1525; H03M 13/151; H03M 13/1515; H03M 13/158; H03M 13/1575; H03M 13/1545
   USPC ................................. 714/781, 782, 784, 785
   See application file for complete search history.

(56) References Cited

U.S. PATENT DOCUMENTS

| | | | | |
|---|---|---|---|---|
| 4,608,692 A | * | 8/1986 | Nagumo | H03M 13/151 714/756 |
| 5,343,481 A | * | 8/1994 | Kraft | H03M 13/00 714/782 |
| 5,875,199 A | * | 2/1999 | Luthi | H03M 13/293 714/755 |
| 9,317,352 B2 | * | 4/2016 | Murata | G06F 11/0727 |
| 2006/0218470 A1 | * | 9/2006 | Dickson | G06F 11/1076 714/767 |
| 2007/0198902 A1 | * | 8/2007 | Toda | H03M 13/152 714/782 |
| 2007/0220400 A1 | | 9/2007 | Toda et al. | |
| 2011/0202815 A1 | | 8/2011 | Toda | |
| 2013/0139028 A1 | * | 5/2013 | Goel | H03M 13/152 714/753 |

(Continued)

*Primary Examiner* — Albert Decady
*Assistant Examiner* — Osman M Alshack
(74) *Attorney, Agent, or Firm* — Holtz, Holtz & Volek PC

(57) ABSTRACT

A syndrome calculation circuit receives input data r(x) including data and a parity bit and having a code length n of $(2^m-1)$ bits at maximum which is represented by a Galois field $GF(2^m)$, and performs syndrome calculation so as to meet $$s \equiv \alpha^i + \alpha^j$$

$$z \equiv (\alpha^i+\beta)^{-1} + \beta^{-1} + (\alpha^j+\beta)^{-1} + \beta^{-1} \quad (A)$$

thereby calculating syndromes s and z. An error position polynomial coefficient calculation circuit calculates the coefficient of an error position polynomial to obtain s×z by multiplying s and z by one multiplier. After that, 2-bit error data positions i and j are specified. Errors at the error data positions i and j of the input data are corrected.

6 Claims, 10 Drawing Sheets

(56) References Cited

U.S. PATENT DOCUMENTS

| | | | |
|---|---|---|---|
| 2014/0075267 A1* | 3/2014 | Koji | G06F 11/0727 714/764 |
| 2014/0089768 A1* | 3/2014 | Fujiwara | G06F 11/10 714/785 |
| 2014/0108895 A1* | 4/2014 | Fujiwara | H03M 13/1515 714/781 |
| 2014/0169092 A1 | 6/2014 | Miyamoto et al. | |
| 2015/0212877 A1 | 7/2015 | Kern et al. | |

* cited by examiner

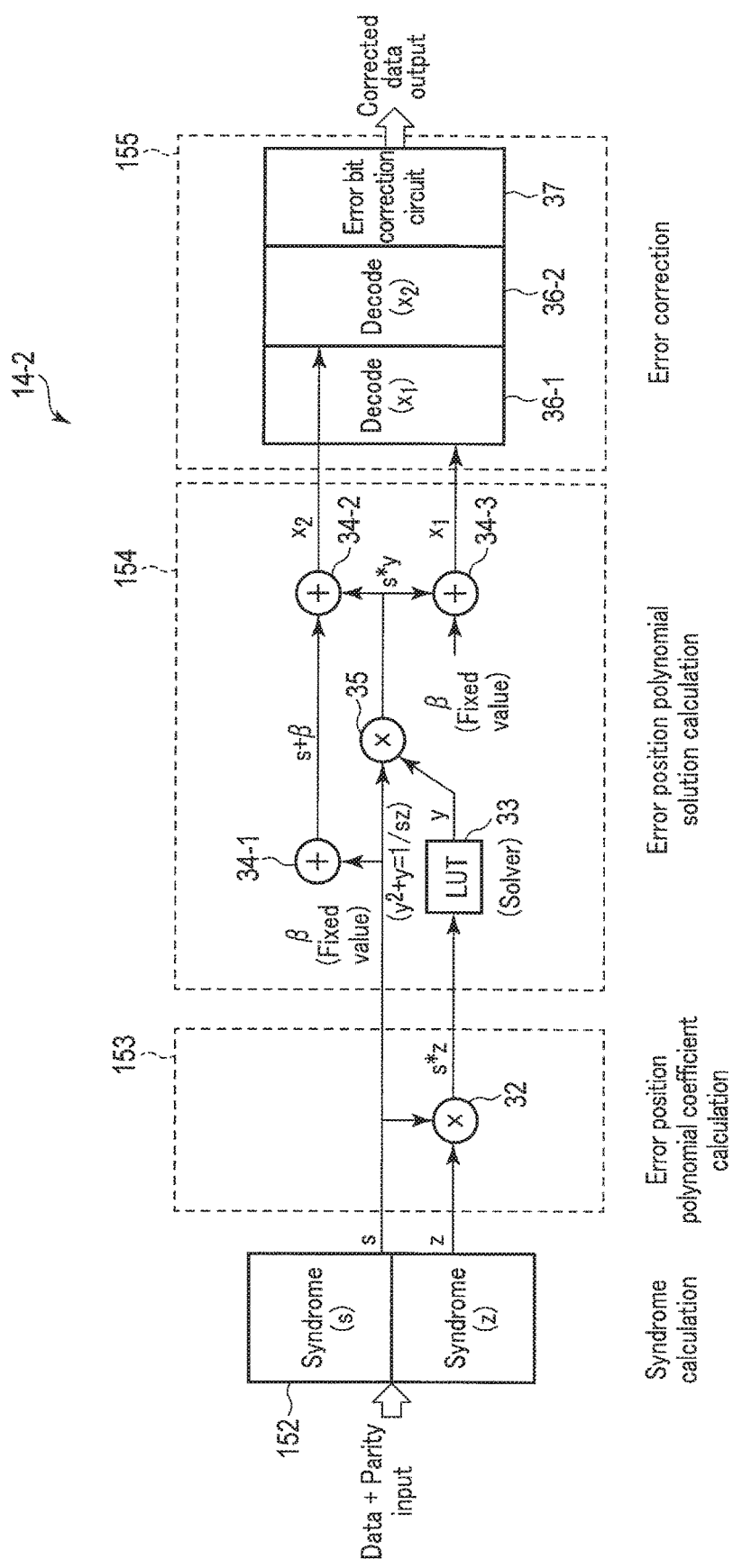
F I G. 7

| Table | $\alpha^{\wedge}0$ | $\alpha^{\wedge}1$ | ... | $\alpha^{\wedge}i$ | ... | $\alpha^{\wedge}(n-1)$ |
|---|---|---|---|---|---|---|
| s[m-1] | bs_0_m-1 | bs_1_m-1 | ... | bs_i_m-1 | ... | bs_n-1_m-1 |
| s[m-2] | bs_0_m-2 | bs_1_m-2 | ... | bs_i_m-2 | ... | bs_n-1_m-2 |
| ... | ... | ... | ... | ... | ... | ... |
| s[1] | bs_0_1 | bs_1_1 | ... | bs_i_1 | ... | bs_n-1_1 |
| s[0] | bs_0_0 | bs_1_0 | ... | bs_i_0 | ... | bs_n-1_0 |

FIG. 8

| Table | $(\alpha^{\wedge}0+\beta)^{\wedge}-1+\beta^{\wedge}-1$ | $(\alpha^{\wedge}1+\beta)^{\wedge}-1+\beta^{\wedge}-1$ | ... | $(\alpha^{\wedge}i+\beta)^{\wedge}-1+\beta^{\wedge}-1$ | ... | $(\alpha^{\wedge}n-1+\beta)^{\wedge}-1+\beta^{\wedge}-1$ |
|---|---|---|---|---|---|---|
| z[m-1] | bz_0_m-1 | bz_1_m-1 | ... | bz_i_m-1 | ... | bz_n-1_m-1 |
| z[m-2] | bz_0_m-2 | bz_1_m-2 | ... | bz_i_m-2 | ... | bz_n-1_m-2 |
| ... | ... | ... | ... | ... | ... | ... |
| z[1] | bz_0_1 | bz_1_1 | ... | bz_i_1 | ... | bz_n-1_1 |
| z[0] | bz_0_0 | bz_1_0 | ... | bz_i_0 | ... | bz_n-1_0 |

FIG. 9

Table of sz and y(8bit)

| sz 7 | sz 6 | sz 5 | sz 4 | sz 3 | sz 2 | sz 1 | sz 0 | y 7 | y 6 | y 5 | y 4 | y 3 | y 2 | y 1 | y 0 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 1 | 1 | 1 | 1 | 1 | 1 | 0 |
| 0 | 0 | 0 | 0 | 0 | 0 | 1 | 0 | 1 | 1 | 1 | 1 | 0 | 0 | 0 | 0 |
| 0 | 0 | 0 | 0 | 0 | 0 | 1 | 1 | 1 | 0 | 1 | 0 | 1 | 1 | 1 | 0 |
| 0 | 0 | 0 | 0 | 0 | 1 | 0 | 0 | 1 | 0 | 0 | 0 | 1 | 0 | 1 | 0 |
| 0 | 0 | 0 | 0 | 0 | 1 | 0 | 1 | 1 | 0 | 0 | 1 | 0 | 0 | 1 | 0 |
| 0 | 0 | 0 | 0 | 0 | 1 | 1 | 0 | 1 | 1 | 0 | 1 | 1 | 0 | 1 | 0 |
| 0 | 0 | 0 | 0 | 0 | 1 | 1 | 1 | 1 | 0 | 1 | 1 | 1 | 1 | 0 | 0 |

⋮

F I G. 10

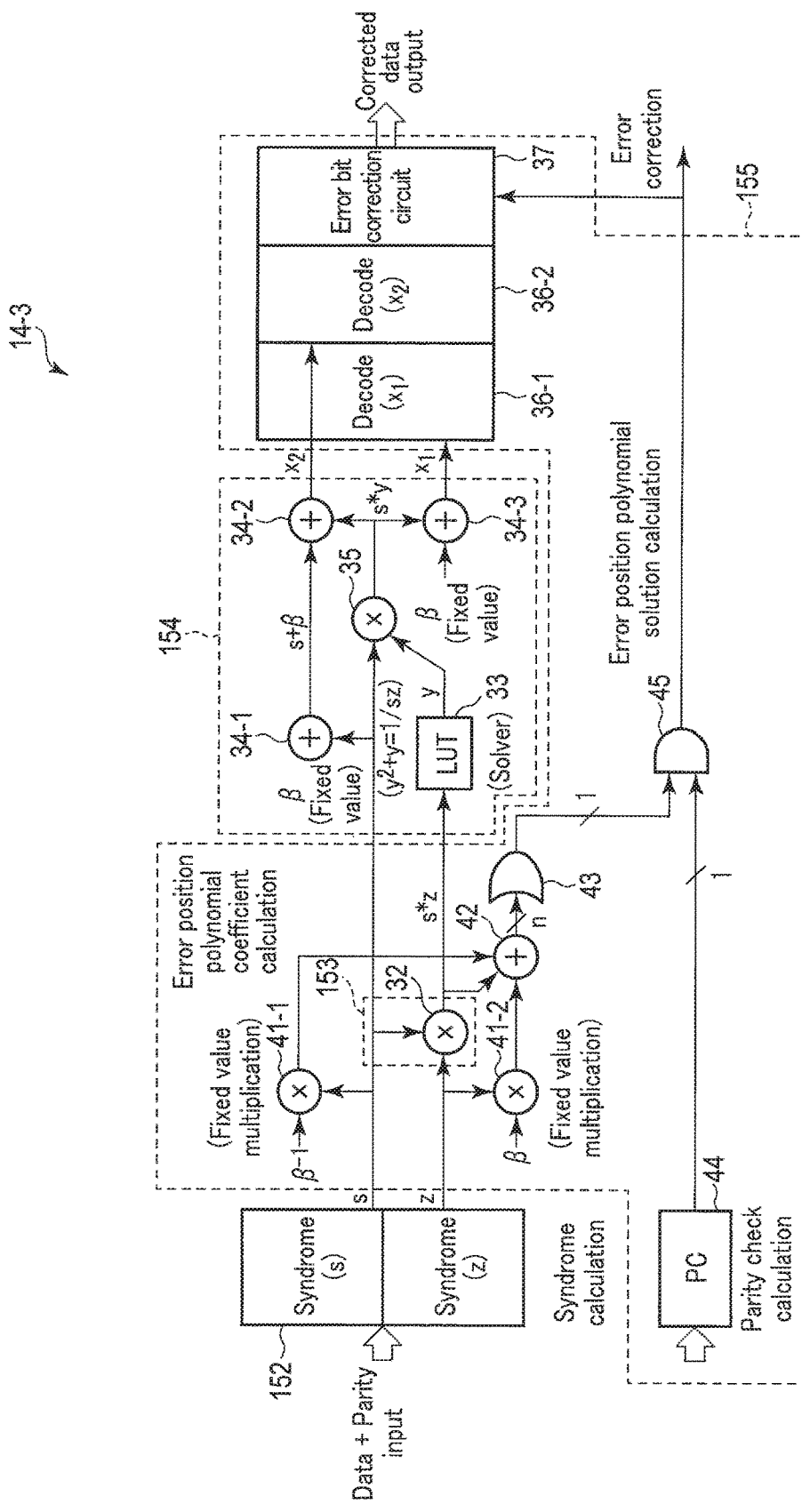
F I G. 13

ECC CIRCUIT, STORAGE DEVICE AND MEMORY SYSTEM

CROSS-REFERENCE TO RELATED APPLICATIONS

This application claims the benefit of U.S. Provisional Application No. 62/306,290, filed Mar. 10, 2016, the entire contents of which are incorporated herein by reference.

FIELD

Embodiments described herein relate generally to an ECC circuit, a storage device, and a memory system.

BACKGROUND

There is widely known an ECC circuit (Error Check and Correction Circuit) that performs error correction of data in a memory system. The ECC circuit is generally required to perform a high-speed operation.

BRIEF DESCRIPTION OF THE DRAWING

FIG. 7 is a view showing a 2-bit error ECC circuit 14-2 according to the first embodiment;

FIG. 8 is a table used to obtain a syndrome s from input data r(x);

FIG. 9 is a table used to obtain a syndrome z from input data r(x);

FIG. 10 is a view showing a correspondence table of 8-bit sz and y;

FIG. 13 is a view showing a 3-bit detection ECC circuit 14-3 according to the second embodiment.

DETAILED DESCRIPTION

Figure 1:
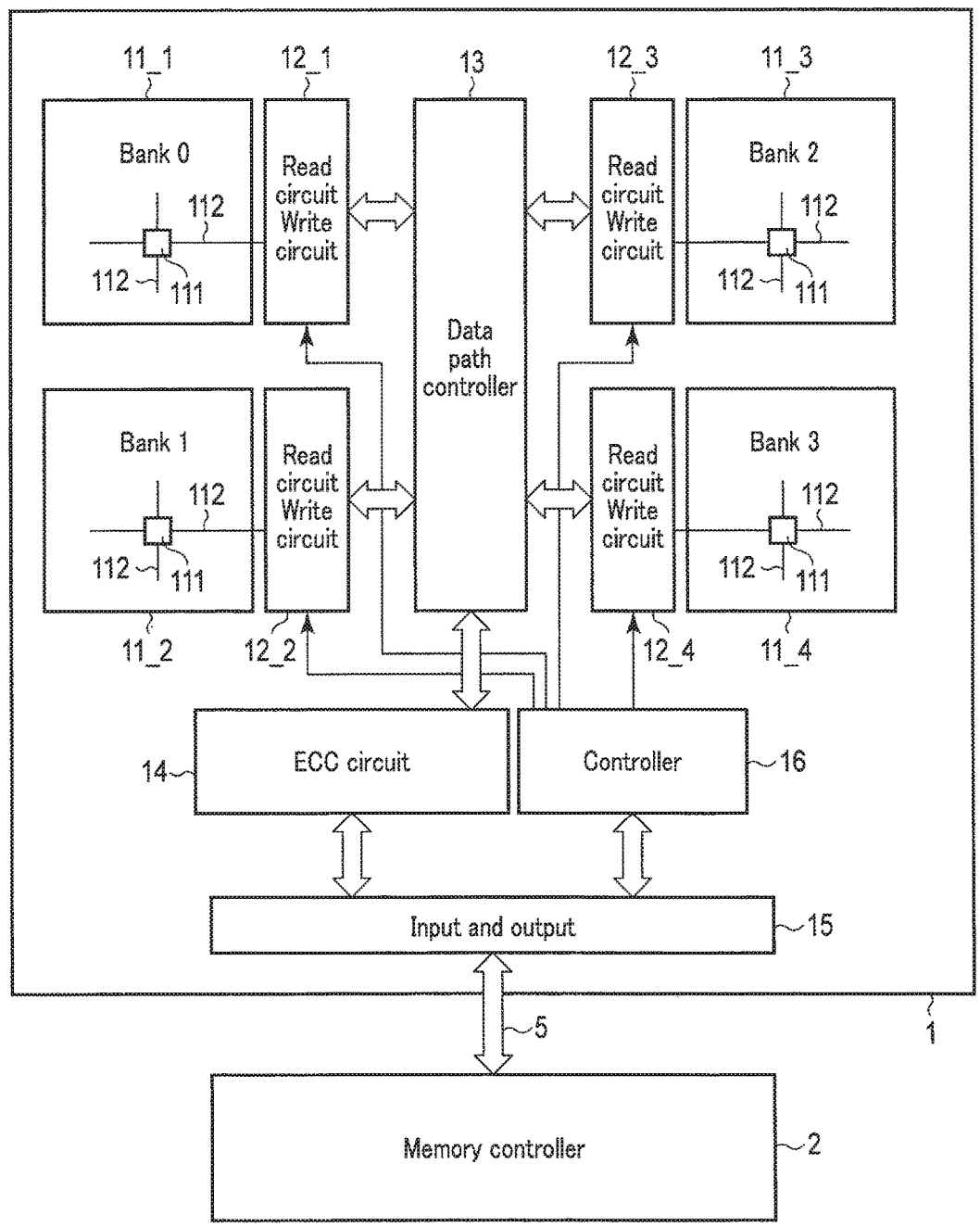
FIG. 1 is a functional block diagram of a memory system to which an ECC circuit 14 according to this embodiment is applied.

In an ECC circuit according to an embodiment, a syndrome calculation circuit receives input data r(x) including data and a parity bit and having a code length n of $(2^m-1)$ bits at maximum which is represented by a Galois field $GF(2^m)$, and calculates a syndrome including a term $(p+\beta)^{-1}$ based on the received input data r(x). An error position polynomial coefficient calculation circuit calculates the coefficient of an error position polynomial based on the calculated syndrome, where n, m: positive integers r(x): a polynomial representing the input data p: an indicator representing an error position α: the nth root of unity that is an element of the Galois field $GF(2^m)$ β: an arbitrary constant of $GF(2^m)$ that is not 0

Embodiments will now be described with reference to the accompanying drawings. Note that in the following embodiments, the same reference numerals denote constituent elements having almost the same functions and arrangements, and a repetitive description will be made only when necessary. The drawings illustrate schematic views. All descriptions about a certain embodiment also apply to another embodiment unless explicitly or self-evidently excluded.

Each functional block shown in the drawings can be implemented by one of hardware and computer software or a combination thereof. Hence, the functional blocks will generally be described below from the viewpoint of their functions to clarify that they can be both of them. The functional blocks need not always be discriminated as illustrated. For example, some functions may be executed by a functional block different from an illustrated functional block. In addition, an illustrated functional block may further be divided into functional sub-blocks. The embodiments are not limited by which functional block specifies a function. The order of steps of procedures illustrated in the drawings can be changed unless explicitly or self-evidently denied.

1 Memory System

1-1 Arrangement

FIG. 1 is a functional block diagram of a memory system to which an ECC circuit according to this embodiment is applied. Note that the memory system shown in FIG. 1 is merely an example. The ECC circuit according to this embodiment is applicable to a memory system of another arrangement as well. The ECC circuit according to this embodiment is applicable not only to the memory system but also to general error correction.

This memory system includes a storage device 1 and a memory controller 2. The storage device 1 is a RAM. The storage device 1 is formed as one semiconductor chip. The storage device 1 can be implemented as RAMs of any types. The storage device 1 is configured to store data using a known arbitrary method. More specifically, the storage device 1 is, for example, a dynamic RAM (DRAM), a magnetoresistive RAM (MRAM), a resistive RAM (ReRAM), or a phase change RAM (PCRAM). The embodiment is not limited by the data storage method of the storage device 1. The constituent elements and connections of portions of the storage device 1 which are known to those skilled in the art change based on the type of the RAM. Hence, FIG. 1 shows examples of elements widely generally included in a RAM. However, the storage device 1 can include functional blocks different from those in FIG. 1 depending on the type of the RAM. The functional blocks included in the storage device 1 are not limited to the examples shown in FIG. 1.

The storage device 1 is communicably connected to the memory controller 2 by a connection line 5. The connection line 5 includes, for example, a power supply line, a data bus, and a command line. The memory controller 2 supplies a command to the storage device 1 and controls the storage device 1 by the command. More specifically, the memory controller 2 instructs to write data to the storage device 1, and also instructs to read specific data from the storage device 1.

As shown in FIG. 1, the storage device 1 includes a plurality of banks 11. FIG. 1 illustrates four banks 11_1 to 11_4. If elements denoted by reference numerals having an underscore and a subsequent number at the end need not be discriminated from each other, the underscore and the subsequent number are omitted. A description without them applies to all elements denoted by reference numerals with the underscore and a subsequent number. Each bank 11 is configured to be able to store data, and includes at least elements such as a plurality of memory cells 111 and various signal lines 112.

Figure 2:
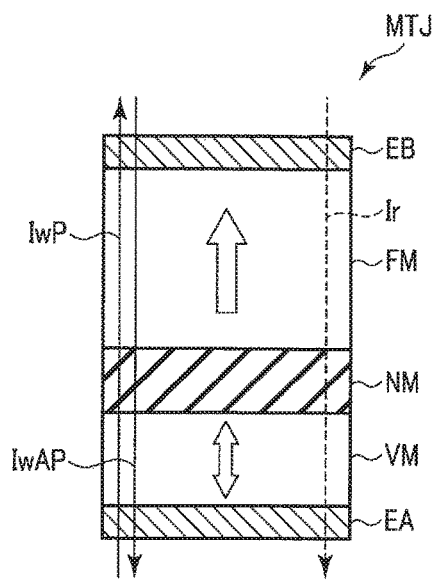
FIG. 2 is a view showing an MTJ element.

Details of the bank 11 also change depending on the type of the RAM serving as the storage device 1. For example, if the storage device 1 is an MRAM, the bank 11 is configured to hold data in the memory cells 111 using a magnetoresistive effect. Each memory cell of the MRAM includes a magnetic tunnel junction (MTJ) element, and nonvolatilely holds data in accordance with the state of magnetization. The MTJ element includes an element MTJ, and includes two magnetic layers FM and VM and a nonmagnetic layer NM between them, as shown in FIG. 2. The direction of magnetization of the magnetic layer FM is unchangeable, and the direction of magnetization of the magnetic layer VM is changeable. The magnetic layers FM and VM have axes of easy magnetization (indicated by arrows) along a direction extending through the interfaces between the layers FM, NM, and VM. The magnetic layers FM and VM may have axes of easy magnetization along the interfaces between the layers FM, NM, and VM. The layers FM, NM, and VM are provided between electrodes EA and EB.

If the directions of magnetization of the magnetic layers FM and VM are parallel or antiparallel, the element MTJ exhibits a minimum or maximum resistance value. The two states capable to transition, which exhibit different resistance values, are assigned to the two values of binary data, respectively. For example, the parallel and antiparallel states of the directions of magnetization of the magnetic layers FM and VM are respectively associated with a state in which a "0" bit is held and a state in which a "1" bit is held. When a write current IwP flows from the magnetic layer VM to the magnetic layer FM, the directions of magnetization of the magnetic layers FM and VM become parallel ("0" data is written to the element MTJ). On the other hand, when a write current IwAP flows from the magnetic layer FM to the magnetic layer VM, the directions of magnetization of the magnetic layers FM and VM become antiparallel ("1" data is written to the element MTJ). Both the write current IwP and IwAP are larger than a threshold Ic necessary to invert the state of the element MTJ. To detect the resistance value of the element MTJ, a read current Ir that passes through the element MTJ is supplied. The read current Ir flows, for example, in the same direction as the current for "1" data write but is smaller than the current for "1" data write.

If the storage device 1 is a DRAM, the bank 11 is configured to hold data in the memory cells 111 using charge accumulation. Each memory cell of the DRAM includes a capacitor, and volatilely holds data in accordance with charges held by the capacitor.

If the storage device 1 is an ReRAM or PCRAM, the bank 11 is configured to hold data in the memory cells 111 using a resistance change. Each memory cell of the ReRAM includes a resistance change element using a metal oxide or perovskite metal oxide. The resistance state changes as the pulse width (pulse application period) or amplitude (current value/voltage value) of a write pulse or the polarity (application direction) of the write pulse changes. Each memory cell of the PCRAM includes a phase change element (resistance change element) using chalcogenide or the like. The resistance state changes as a film in the phase change element is changed to a crystalline state or amorphous state by heat generated by a write current.

The signal lines 112 include, for example, bit lines and word lines. Each bank 11 also includes a control circuit (not shown) for the bank.

The storage device 1 also includes associated circuits 12_1 to 12_4. The associated circuits 12_1 to 12_4 are provided for the banks 11_1 to 11_4, respectively. Each associated circuit 12 controls a corresponding bank 11, and includes, for example, a read circuit and a write circuit. The read circuit and write circuit include, for example, a driver, a decoder, a page buffer, and a sense amplifier. The decoder selects the memory cell 111 specified by an address signal from the memory controller 2. The page buffer temporarily holds data to a corresponding bank 11 or from the bank 11. The read circuit discriminates data from the selected memory cell 111. The write circuit writes designated data to the selected memory cell 111.

The storage device 1 also includes a data path controller 13, an error correction code (ECC) circuit 14, an input/output circuit 15, and a controller 16. The data path controller 13 is connected between the associated circuits 12 and the ECC circuit 14. The data path controller 13 is connected to all associated circuits 12, includes a plurality of signal lines (buses), and connects one or a plurality of circuits out of the associated circuits 12 to the ECC circuit 14. The input/output circuit 15 controls signal transmission between the storage device 1 and the memory controller 2. For example, the input/output circuit 15 supplies write data from the memory controller 2 to the ECC circuit 14, and outputs read data from the ECC circuit 14 to the memory controller 2. In addition, the input/output circuit 15 supplies a command and an address signal from the memory controller 2 to the controller 16. The controller 16 includes elements such as a command decoder, a latch, a buffer, and a voltage generation circuit, and controls the constituent elements of the storage device 1 based on the received command and address signal.

Figure 3:
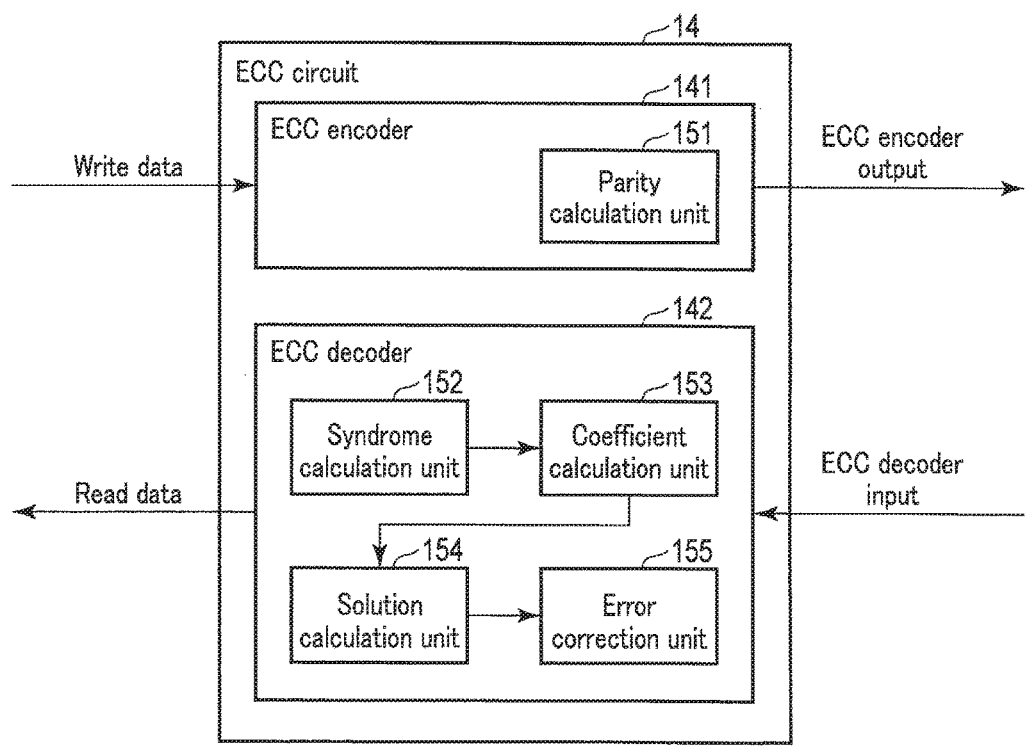
FIG. 3 is a view showing the arrangement of the ECC circuit.

As shown in FIG. 3, the ECC circuit 14 includes an ECC encoder 141 and an ECC decoder 142. The ECC encoder 141 includes a parity calculation unit 151.

The ECC encoder 141 receives write data (1- or 0-bit string), generates an error correction code (parity bit) for each division unit (ECC word) of the write data in accordance with a predetermined error correction code generation rule, and outputs the set of the write data and the parity bit (ECC encoder output). More specifically, the ECC encoder 141 generates a parity bit from received write data in accordance with a predetermined error correction code generation rule, and generates an ECC encoder output by concatenating the write data and the parity bit. The parity calculation unit 151 performs calculation to generate a parity bit.

At the time of read, the ECC decoder 142 receives data from the banks 11_1 t 11_4 designated by the controller 16. Data from the bank 11 is received by the ECC decoder 142, and therefore, will also be referred to as an ECC decoder input hereinafter. The ECC decoder input includes a set of data (read data) requested to be read and a parity bit, like the ECC encoder output. The ECC decoder input includes the ECC encoder output, and sometimes includes an error.

The ECC decoder 142 calculates a syndrome from the ECC decoder input for each ECC word, corrects an error of read data in the ECC decoder input using the syndrome, and outputs an ECC decoder output.

The ECC decoder 142 includes a syndrome calculation unit 152, an error position polynomial coefficient calculation unit 153, an error position polynomial solution calculation unit 154, and an error correction unit 155. As for the detailed operations of the syndrome calculation unit 152, the error position polynomial coefficient calculation unit 153, the error position polynomial solution calculation unit 154, and the error correction unit 155, operations according to the first and second embodiments to be described later are applied.

1-2 Operation

The operation of the ECC circuit 14 in the memory system according to this embodiment will be described next.

1-2-1 Write Operation

Figure 4:
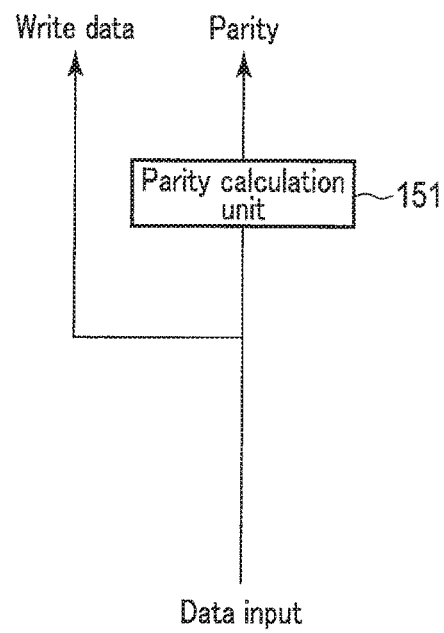
FIG. 4 is a view for explaining the operation of the ECC circuit 14 for write data.

Upon receiving, from the input/output circuit 15, write data from the memory controller 2, the ECC circuit 14 operates in the following way. The write data is received by the ECC encoder 141. The ECC encoder 141 calculates a parity bit from the write data by the parity calculation unit 151, as shown in FIG. 4. The ECC encoder 141 concatenates the write data and the parity bit and outputs an ECC encoder output.

The ECC encoder output is directly supplied to the write target bank 11 via the data path controller 13. The write target bank 11 writes the ECC encoder output to the memory cell 111.

1-2-2 Read Operation

Upon receiving a specific data read instruction from the memory controller 2 (ST1), the storage device 1 reads a data set that concatenates data (read data) and a parity bit from the bank 11 designated by the controller 16 in accordance with the read instruction, and supplies it to the ECC circuit 14. The ECC decoder input includes the ECC encoder output, and sometimes includes an error.

The ECC decoder 142 executes error correction processing for the received ECC decoder input.

Figure 5:
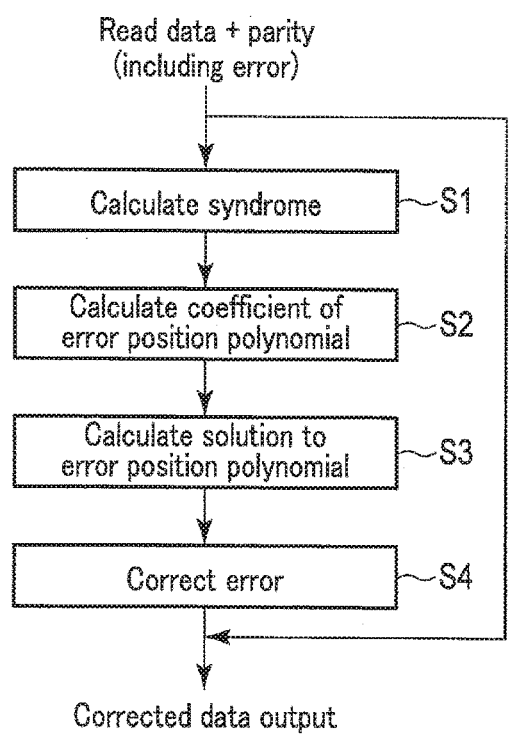
FIG. 5 is a flowchart for explaining the operation of the ECC circuit 14 for read data.

More specifically, as shown in FIG. 5, the ECC decoder 142 sequentially performs syndrome calculation (step S1) by the syndrome calculation unit 152, error position polynomial coefficient calculation (step S2) by the error position polynomial coefficient calculation unit 153, and error position polynomial solution calculation (step S3) by the error position polynomial solution calculation unit 154 for the received ECC decoder input, thereby specifying an error position. When the error position is specified, the ECC decoder 142 corrects the error bit ("0" data is corrected to "1", and "1" data is corrected to "0") by the error correction unit 155 (step S4), and outputs the corrected data to the outside of the chip.

2 First Embodiment

2-1 Outline of Error Correction Method of ECC Circuit

Along with the growth in the capacity and the progress of microfabrication technologies of semiconductor memories, introduction of an error correction system is essential to meet a requirement for a high yield. In addition, the number of error-correctable bits tends to increase. In recent years, an error correction system is needed even in a RAM (a non-volatile RAM such as a DRAM (Dynamic Random Access Memory), an MRAM (Magnetoresitive Random Access Memory), an ReRAM (Resistance Random Access Memory), or an FeRAM (Ferroelectric Random Access Memory)) capable of access at a very high speed. An error correction system that does not degrade original performance is required.

In general, when the number of correctable error bits increases, the number of elements and the latency of an ECC circuit increase. For this reason, an increase in cost and degradation in performance occur in exchange for reliability maintenance/improvement. For example, an ECC circuit capable of correcting a 2-bit error is known to have a large calculation scale. Hence, a high-speed area-saving ECC circuit has been considered.

2-2 2-Bit ECC Circuit for Comparison

2-2-1 Arrangement

Figure 6:
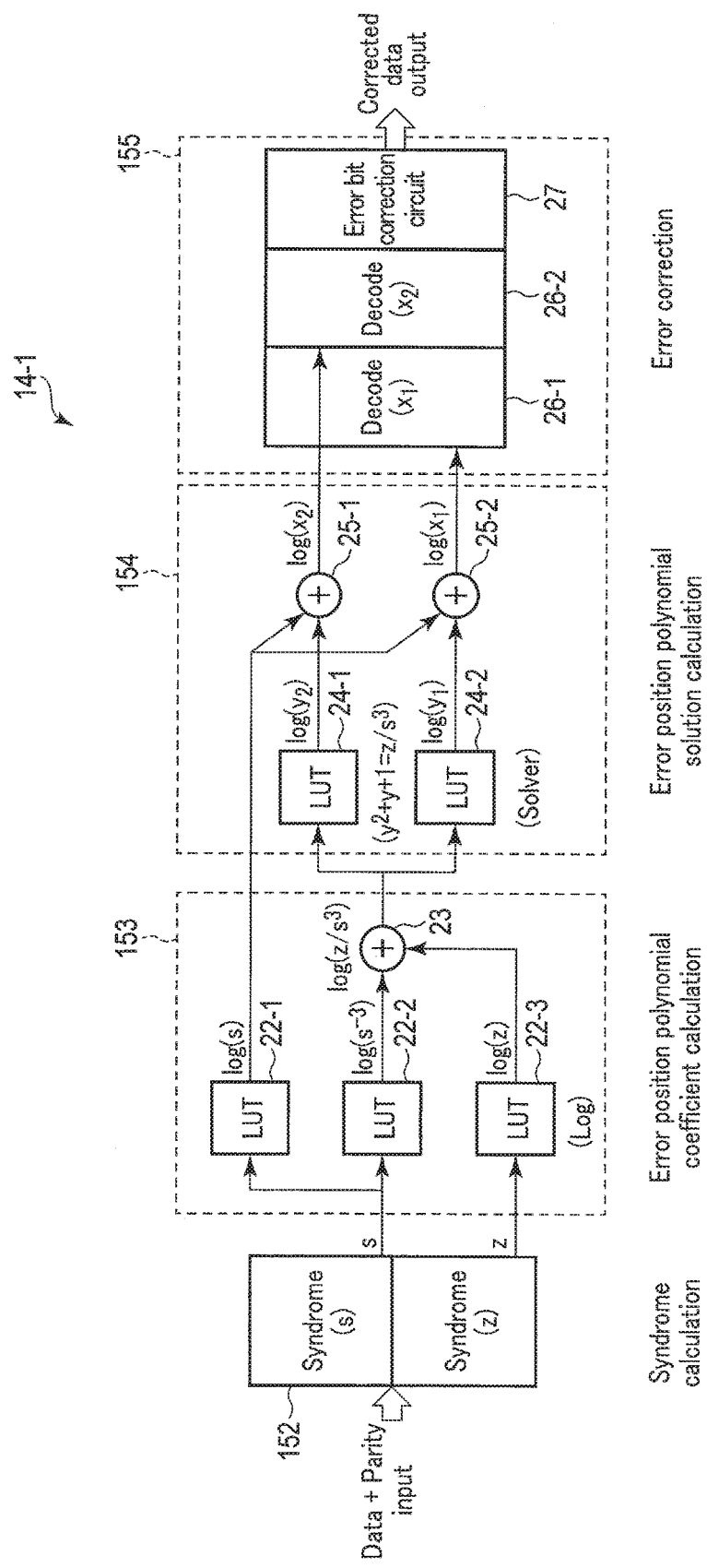
FIG. 6 is a view showing an ECC circuit 14-1 that uses a BHC code and is capable of high-speed processing for the sake of comparison.

FIG. 6 is a view showing an ECC circuit 14-1 that uses a BHC code and is capable of high-speed processing for the sake of comparison.

As shown in FIG. 6, the ECC circuit 14-1 for comparison performs data input, syndrome calculation, error position polynomial coefficient calculation, error position polynomial solution calculation, error correction, and data output from the left side.

In the syndrome calculation, a syndrome calculation unit 152 performs syndrome calculation for input data with a parity bit, and obtains syndromes s and z. The syndrome calculation method will be described later.

An error position polynomial coefficient calculation unit 153 includes tables (LUTs: Look Up Tables) 22-1 to 22-3 and an adder 23. The error position polynomial coefficient calculation uses the Peterson method, the Berlekamp-Massey method, the Euclid method, direct calculation, or the like. Here, an arrangement that uses, in the error position polynomial coefficient calculation, the direct calculation method capable of performing 2-bit error correction at a high speed is illustrated.

The table 22-1 converts the syndrome s calculated by the syndrome calculation unit 152 into $\log(s)$.

The table 22-2 converts the syndrome s calculated by the syndrome calculation unit 152 into $\log(s^{-3})$.

The table 22-3 converts the syndrome z calculated by the syndrome calculation unit 152 into $\log(z)$.

The adder 23 adds $\log(s^{-3})$ converted by the table 22-2 and $\log(z)$ converted by the table 22-3, and outputs $\log(z/s^3)$. Note that the adder shown in FIG. 6 calculates $\mod(2^m-1)$ (for example, mod 255 for 8-bit data).

The error position polynomial solution calculation unit 154 includes tables 24-1 and 24-2 and adders 25-1 and 25-2.

The table 24-1 converts $\log(z/s^3)$ output from the adder 23 into $\log(y_2)$.

The table 24-2 converts $\log(z/s^3)$ output from the adder 23 into $\log(y_1)$.

The adder 25-1 adds $\log(s)$ converted by the table 22-1 and $\log(y_2)$ converted by the table 24-1, and outputs $\log(x_2)$ that is a solution to an error position polynomial.

The adder 25-2 adds $\log(s)$ converted by the table, 22-1 and $\log(y_1)$ converted by the table 24-2, and outputs $\log(x_1)$ as a solution to an error position polynomial.

An error correction unit 155 includes decoding units 26-1 and 26-2 and an error bit correction circuit 27.

The decoding unit 26-1 selects a 1-bit error data position from $\log(x_1)$ output from the adder 25-2.

The decoding unit 26-2 selects a 1-bit error data position from $\log(x_2)$ output from the adder 25-1.

For example, if $\log(x)$ is a 2-bit value "ab" (a, b=0 or 1), an error position 0=(~a and ~b), an error position 1=(~a and b), and an error position 2=(a and ~b) are selected.

Note that the error position polynomial solution calculation unit uses a method such as Chien search or a search using a table (LUT: Look Up Table). In this example, an arrangement of a high-speed table search is illustrated.

The error bit correction circuit 27 specifies, by an OR circuit, two error bits at maximum selected by the decoding units 26-1 and 26-2. The specified error bits are inverted, thereby performing error correction.

2-2-2 Syndrome Calculation of Comparative Example

The syndrome calculation of the 2-bit error ECC circuit 14-1 for comparison shown in FIG. 6 will be described next.

An example of a BCH code for binary 2-bit correction will be described here. Terms are defined as follows:

code length (corresponding to the total number of input data) $n=2^m-1$ (m is the number of bits), α: the nth root of unity that is an element of a Galois field GF $(2^m)$ $m_1(x)$: a primitive polynomial on GF(2) of α (characteristic representing $m_1(\alpha)=0$)

$m_3(x)$: a primitive polynomial of $\alpha^3$ (characteristic representing $m_3(\alpha^3)=0$)

generator polynomial $g(x)=LCM(m_1(x), m_3(x))=m_1(x) \cdot m_3(x)$ d(x): write data expressed as a polynomial (the parity portion is all "0")

The polynomial expression means expressing data $d_{143}$, $d_{142}, \ldots, d_1, d_0$ as $d(x)=d_{143}x^{143}+d_{142}x^{142}+\ldots+d_1x+d_0$.

On GF(2), since 1+1=0, subtraction can be regarded as addition. In addition, there is no carry. A "+" sign is assumed to correspond to an XOR circuit (exclusive OR circuit) without a carry unless otherwise specified. When writing 128-bit data, $GF(256=2^8)$ is used, $m_1(x)$ and $m_3(x)$ are 8th degree polynomials, g(x) is a 16th degree polynomial, and d(x) is a 144th degree polynomial (128+16) (all coefficients of $x^i$ (i=0 to 15) of d(x) are 0). At the time of encoding (write), a parity $p(x) \equiv d(x)$ (mod g(x)) is generated, and write data $w(x)=d(x)+p(x)$ is written in the memory cells. When p(x) is regarded as a remainder obtained by dividing d(x) by g(x), w(x) can be divided by g(x) (w(x)≡0 (mod g(x)), as can be seen. Also, w(x) can be divided by $m_1(x)$ or $m_3(x)$, as a matter of course. At the time of decoding, using a polynomial e(x) representing an error position ($e(x)=x^i+x^j$ if errors exist at the ith and jth positions), the ECC circuit 14-1 receives data $r(x)=w(x)+e(x)$.

In the syndrome calculation, the syndrome calculation unit 152 calculates s and z ($s_1$ and $s_3$ from the viewpoint of textbook) given by $$s \equiv r(\alpha) \equiv e(\alpha) (\text{mod } m_1(\alpha))$$

$$z \equiv r(\alpha) \equiv e(\alpha) (\text{mod } m_3(\alpha))$$

s is a remainder obtained by dividing e(α) by $m_1(\alpha)$, and z(α) is a remainder obtained by dividing e(α) by $m_3(\alpha)$. That is, $$e(\alpha)=\alpha^i+\alpha^j=m_1(\alpha)q_1(\alpha)+s=m_3(\alpha)q_3(\alpha)+z$$

(q(x) is a quotient obtained by dividing e(x) by m(x)). When x=α and $\alpha^3$ are substituted, we obtain $$e(\alpha)=\alpha^i+\alpha^j \equiv s$$

$$e(\alpha^3)=\alpha^{3i}+\alpha^{3j} \equiv z$$

as can is apparent. When the solutions of the two error positions are $p \equiv \alpha^i$ and $q \equiv \alpha^j$ (mod $m_1(\alpha)$) (p≠q because i≠j), $$s=p+q, z=p^3+q^3$$

Namely, p and q are indicators representing error positions, respectively. For s and z, a ratio circuit of $m_1(\alpha)$ and $m_3(\alpha)$ can be used. If an LFSR (Linear Feedback Shift Register) known well as a ratio circuit is used, the syndrome calculation unit 152 can be implemented in a small area. In particular, when data are transferred (serial transfer) over a plurality of clocks, the data are sequentially calculated. As a result, the syndrome calculation unit 152 can be implemented in a small area.

Actual syndrome calculation for input data is performed in the following way. The data is represented by $$r(x)=r_{n-1}x^{n-1}+r_{n-2}x^{n-2}+\ldots+r_1x+r_0$$

In this case, input data includes n input data $r_0, r_1, \ldots, r_{n-2}, r_{n-1}$ (all the data are 0 or 1). For example, when the input data are $r_0=1, r_1=1, \ldots, r_{n-2}=0, r_{n-1}=1, r(x)=x^{n-1}+\ldots+x+1$. In an example in which m=8, $n=2^8-1=255$. On GF(2), "+" represents addition (XOR) without a carry (0+0=0, 0+1=1, 1+0=1, and 1+1=0). As described above, α is the nth root of unity (that meets $\alpha^n=1$) and is also called the atomic element of GF($2^m$). When m=8, an example of the primitive polynomial is $m_1(x)=x^8+x^4+x^3+x^2+1$. When $m_1(x)$ is used, α meets $\alpha^n=1$, and particularly meets $m_1(\alpha)=\alpha^8+\alpha^4+\alpha^3+\alpha^2+1=0$. When this is expressed by an m-dimensional vector (m-bit sequence), expressions such as α=(00000010), $\alpha^2$=(00000100), ... are often used based on 0=(00000000) and 1=(00000001). In addition, $\alpha^7$=(10000000), $\alpha^8=\alpha^4+\alpha^3+\alpha^2+1$=(000011101), and $\alpha^9=\alpha^8*\alpha=\alpha^5+\alpha^4+\alpha^3+\alpha$=(000111010) are obtained ($\alpha^i$ can be obtained in the same way). Note that the vector sequence indicates the coefficient of a polynomial as a remainder obtained by dividing $\alpha^i$ by $m_1(\alpha)$ (for example, a remainder obtained by dividing $\alpha^9$ by $m_1(\alpha)$ is $\alpha^5+\alpha^4+\alpha^3+\alpha$). The syndromes s and z ($s_1$ and $s_3$ from the viewpoint of textbook) are defined as remainders obtained by dividing r(α) by $m_1(\alpha)$ and $m_3(\alpha)$ (as $m_3(x)$, an equation that meets $m_3(\alpha^3)=0$ is obtained). Since $r(\alpha)=r_{n-1}\alpha^{n-1}+r_{n-2}\alpha^{n-2}+\ldots+r_1\alpha+r_0$, and the vector sequence indicates a remainder obtained by dividing $\alpha^i$ by $m_1(\alpha)$, s that is a remainder obtained by dividing r(α) by $m_1(\alpha)$ is given by $s=r_{n-1}(10001110)+r_{n-2}(01000111)+\ldots r_1(00000010)+r_0(00000001)$ in a case in which $\alpha^{n-1}$=(10001110) and $\alpha^{n-2}$=(01000111). Letting $s_k$ be the kth (k=0 to m-1) bit of s, $s_0=r_{n-2}+\ldots+r_0, s_1=r_{n-1}+r_{n-2}+\ldots+r_1$, and the like. Actual calculation is done by performing this calculation as many times as m bits. This also applies to z.

2-3 Error Position Polynomial Coefficient Calculation of Comparative Example The first step to obtain an error position from a syndrome is to obtain an error position polynomial. The error position polynomial is a polynomial having p and q as solutions and is represented by $$(x+p)(x+q) = x^2 + (p+q)x + pq = x^2 + sx + s^2 + \frac{z}{s}$$

(from p+q=s, and $s^3=(p+q)^3=p^3+q^3+pq(p+q)=z+pqs$, pq=$(s^2+z)/s$). When $s^2+z/s$ or x=sy, the error position polynomial is $$y^2 + y + 1 + \frac{z}{s^3}$$

Hence, the error position polynomial coefficient calculation (see FIG. 6) is to obtain $z/s^3$.

Dividing a value that is not fixed costs much. Hence, various methods have been proposed, as described above. An example will be described here in which to obtain $z/s^3$ at a high speed, conversions $s \Rightarrow \log(s^{-3})$ and $z \Rightarrow \log(z)$ are performed using an LUT, and addition $(\log(z/s^3) = \log(s^{-2}) + \log(z))$ is performed. When calculating on. GF($2^m$), s and z are m-bit values in general. Note that in logarithmic calculation of multiplication on GF($2^m$), since "+" indicates $\alpha^{2^m-1}=1$, unlike XOR above, $\log(\alpha^u \cdot \alpha^v) = \log(\alpha^{u+v}) = \log(\alpha^{u+v \pmod{2^m-1}}) = u+v \pmod{2^m-1}$ which represents an addition circuit considering a remainder (carry) of $2^m-1$ (for example, if m=8, the remainder is obtained by division by 255). The speed is generally lower than that of an addition circuit without a carry.

2-2-4 Error Position Polynomial Solution Calculation of Comparative Example

As the error position polynomial solution calculation (calculation for obtaining solution s of $y^2+y+1+2/s^3=0$), an example using an LUT is shown. In FIG. 6, a correspondence table of $\log(z/s^3)$ and $\log(y)$ is prepared in advance, and a search is performed. When $\log(y)$ is obtained, $\log(x)$ is obtained from $\log(x) = \log(s) + \log(y)$ ("+" indicates addition that needs a carry) ($\log(s)$ needs to be obtained by an LUT in advance). Since the error position polynomial is a quadratic expression, there are two solutions at maximum. For example, two solutions $\log(p)$ and $\log(q)$ are calculated by preparing two LUTs.

Each of the decoding units 26-1 and 26-2 can select a 1-bit data position corresponding to $\log(x)$ (m-bit) from ($2^m-1$) bits at maximum. A 2-bit correction circuit includes two decoding units because there can be two error positions at maximum. Finally, the error bit correction circuit 27 specifies two positions at maximum by an OR circuit, corrects data, and outputs the corrected data.

2-3 First Embodiment

2-3-1 Arrangement

FIG. 7 is a view showing a 2-bit error ECC circuit 14-2 according to the first embodiment.

As shown in FIG. 7, the ECC circuit 14-2 according to the first embodiment performs data input, syndrome calculation, error position polynomial coefficient calculation, error position polynomial solution calculation, error correction, and data output from the left side.

In the syndrome calculation, a syndrome calculation unit 152 performs syndrome calculation for input data with a parity bit, and obtains syndromes s and z. As for the calculation method, the syndrome calculation is different from that of the ECC circuit 14-1 for comparison described with reference to FIG. 6, and details will be described later.

An error position polynomial coefficient calculation unit 153 uses one multiplier 32. The multiplier 32 calculates the multiplication result s*z of the syndromes s and z calculated by the syndrome calculation unit 152.

An error position polynomial solution calculation unit 154 includes a table 33, XOR circuits 34-1 to 34-3, and a multiplier 35.

Figure 11:
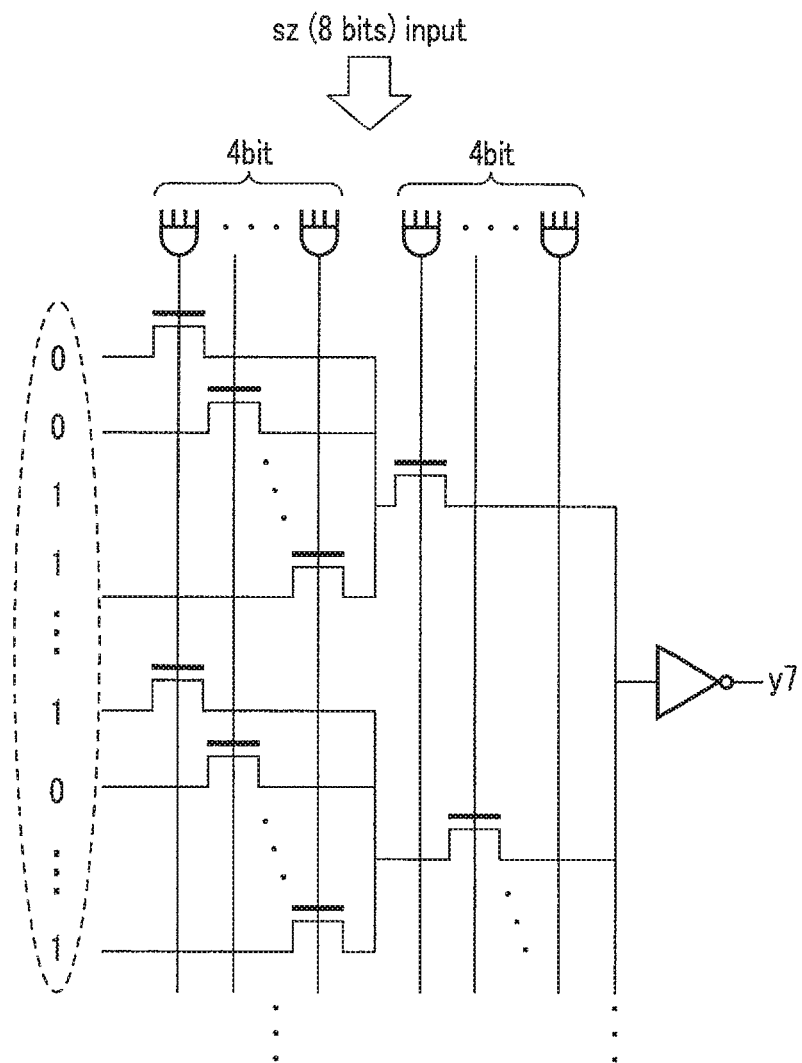
FIG. 11 is a view showing the detailed circuit arrangement of a y7 portion of a table 33 shown in FIG. 10.

The table 33 converts the multiplication result s*z calculated by the multiplier 32 into y. FIG. 10 is a view showing a correspondence table of 8-bit sz and y. FIG. 11 is a view showing the detailed circuit arrangement of a y7 portion of the table 33 shown in FIG. 10.

In FIG. 11, sz is input in 256 (8-bit) different patterns, and y0 to y7 corresponding to the input sz are output in 256 (8-bit) different patterns. A portion surrounded by a broken line in FIG. 11 indicates values set to implement the table 33 shown in FIG. 10, and the values are prepared in 256 (8-bit) different patterns. Transistors Tr are designed to output y0 to y7 shown in FIG. 10 in correspondence with the input sz and the set values.

Referring back to FIG. 7, the XOR circuit 34-1 calculates the exclusive OR of the syndrome s calculated by the syndrome calculation unit 152 and $\beta$ (fixed value), and outputs s+$\beta$. The definition of $\beta$ will be described later.

The multiplier 35 multiplies the syndrome s calculated by the syndrome calculation unit 152 by y converted by the table 33, and outputs s*y.

The XOR circuit 34-2 calculates the exclusive OR of s+$\beta$ output from the XOR circuit 34-1 and s*y output from the multiplier 35, and outputs $x_2$ that is a solution to the error position polynomial.

The XOR circuit 34-3 calculates the exclusive OR of $\beta$ (fixed value) and s*y output from the multiplier 35, and outputs $x_1$ that is a solution to the error position polynomial.

An error correction unit 155 includes decoding units 36-1 and 36-2 and an error bit correction circuit 37.

The decoding unit 36-1 selects a 1-bit error data position i based on $x_1$ output from the XOR circuit 34-3.

The decoding unit 36-2 selects a 1-bit error data position j based on $x_2$ output from the XOR circuit 34-2.

The error bit correction circuit 37 specifies, by an OR circuit, two error bits at maximum selected by the decoding units 36-1 and 36-2. The specified error bits are inverted, thereby performing error correction.

2-3-2 Syndrome Calculation of First Embodiment

The syndrome calculation of the 2-bit error ECC circuit 14-2 according to the first embodiment shown in FIG. 7 will be described next.

A BCH/RS code is cyclic and very suitable for serial transfer. If latency is regarded as important, parallel processing is performed to attain a high speed. However, this leads to an increase in the area of the ECC circuit 14-2. For this reason, not the BCH code suitable for serial processing but a code suitable for parallel processing is preferably used. This embodiment proposes a method capable of reducing the area when performing parallel processing as compared to the conventional code.

The syndrome calculation is changed from s=p+q and $z=p^3+q^3$ described as the comparative example to $$s = \alpha^i + \alpha^j$$

$$z = (\alpha^i + \beta)^{-1} + \beta^{-1} + (\alpha^j + \beta)^{-1} + \beta^{-1}$$

Note that if $p = \alpha^i$ and $q = \alpha^j$, $$s = p + q$$

$$z = (p+\beta)^{-1} + \beta^{-1} + (q+\beta)^{-1} + \beta^{-1}$$

may be used.

$\beta$ is an arbitrary constant of $GF(2^m)$ that is not 0, and $\beta \neq \alpha^i$ (that is, the calculation cannot be used in a portion where $\beta = \alpha^i$).

In the comparative example, z in a portion corresponding to $s \equiv \alpha^i$ is $z \equiv \alpha^{3i}$. In the above case, however, z in a portion corresponding to $s \equiv \alpha^i$ is $z \equiv (\alpha^i + \beta)^{-1} + \beta^{-1}$. s and z are calculated in advance for $\alpha^i$, and a syndrome circuit corresponding to them is formed. If no error exists, $s = z = 0$, as in the comparative example. For a 1-bit error, $$s \equiv \alpha^i \equiv p$$

$$z \equiv (\alpha^i + \beta)^{-1} + \beta^{-1}$$

For a 2-bit error, $$s \equiv \alpha^i + \alpha^j \equiv p + q, z \equiv \left(\frac{1}{p+\beta} + \frac{1}{\beta}\right) + \left(\frac{1}{q+\beta} + \frac{1}{\beta}\right) = \frac{1}{p+\beta} + \frac{1}{q+\beta}$$

$\beta$ is used to avoid inconsistency in a case in which $p=0$ or $q=0$ which corresponds to a case in which no error exists.

A method of obtaining the syndromes s and z from n-bit input data $r(x)$ (=d_0, d_1, . . . , d_i, . . . , d_n–1) will be described next.

FIG. 8 is a table used to obtain the syndrome s from the input data $r(x)$. FIG. 9 is a table used to obtain the syndrome z from the input data $r(x)$.

When correcting one bit, the table shown in FIG. 8 is used for the syndrome s.

When correcting two bits, the table shown in FIG. 8 is used for the syndrome s, and the table shown in FIG. 9 is used for the syndrome z.

Here, bs_0_m–1 to bs_n–1_0 in the table shown in FIG. 8 and bz_0_m–1 to bz_n–1_0 in the table shown in FIG. 9 are predetermined fixed values "0" or "1".

The syndrome s is calculated based on the input data $r(x)$ and the table shown in FIG. 8 by $$s[m-1] = \Sigma(d\_i * bs\_i\_m-1) \ (i = \text{sum of } 0 \text{ to } n-1)$$

$$s[m-2] = \Sigma(d\_i * bs\_i\_m-2) \ (i = \text{sum of } 0 \text{ to } n-1)$$

$$\vdots$$

$$s[1] = \Sigma(d\_i * bs\_i\_1) \ (i = \text{sum of } 0 \text{ to } n-1)$$

$$s[0] = \Sigma(d\_i * bs\_i\_0) \ (i = \text{sum of } 0 \text{ to } n-1)$$

The syndrome z is calculated based on the input data $r(x)$ and the table shown in FIG. 9 by $$z[m-1] = \Sigma(d\_i * bz\_i\_m-1) \ (i = \text{sum of } 0 \text{ to } n-1)$$

$$z[m-2] = \Sigma(d\_i * bz\_i\_m-2) \ (i = \text{sum of } 0 \text{ to } n-1)$$

$$\vdots$$

$$z[1] = \Sigma(d\_i * bz\_i\_1) \ (i = \text{sum of } 0 \text{ to } n-1)$$

$$z[0] = \Sigma(d\_i * bz\_i\_0) \ (i = \text{sum of } 0 \text{ to } n-1)$$

As described above, the syndromes s and z up to a 2-bit error can be calculated using the tables shown in FIGS. 8 and 9.

2-3-3 Error Position Polynomial Coefficient Calculation of First Embodiment

An error position polynomial is obtained as $$z = \frac{1}{p+\beta} + \frac{1}{q+\beta} = \frac{p+q}{pq + (p+q)\beta + \beta^2} = \frac{s}{pq + s\beta + \beta^2} \Rightarrow pq = \frac{s}{z} + s\beta + \beta^2$$

An error position polynomial for double errors is $$x^2 + (p+q)x + pq = x^2 + sx + \frac{s}{z} + s\beta + \beta^2 = (x+\beta)^2 + s(x+\beta) + \frac{s}{z}$$

When $x = sy + \beta$, the error position polynomial is $$y^2 + y + \frac{1}{sz}$$

Considering the correspondence table (LUT) of sz and y provided in the error position polynomial solution calculation unit 154, the error position polynomial coefficient calculation unit 153 need only calculate sz, and the calculation is very light. That is, division need not be performed, and the calculation can be done only by the multiplier.

2-3-4 Error Position Polynomial Solution Calculation of First Embodiment

In the error position polynomial solution calculation, sz is converted into y, and x is obtained from $x = sy + \beta$. Two solutions are calculated.

According to $$y^2 + y = \frac{1}{sz} \leftrightarrow y(y+1) = \frac{1}{sz}$$

if $y = y_1$ is a solution, $y_1 + 1$ is also a solution (($y_1 + 1$) (($y_2 + 1) + 1) = y_1(y_1 + 1)$). For this reason, if one solution is $x_1 = sy_1 + \beta$, $x_2 = s(y_1 + 1) + \beta = sy_1 + s + \beta$ is obtained. The subsequent decoding operation is the same as in the comparative example. As for the multiplier on $GF(2^m)$, a remainder obtained by division by $m_1(x)$ is output. Since $(a_{m-1}x^{m-1} + a_{m-2}x^{m-2} + \ldots + a_0x^0) \times (b_{m-1}x^{m-1} + b_{m-2}x^{m-2} + \ldots + b_0x^0)$ mod $m_1(\alpha) = c_{2m-2}x^{2m-2} + c_{2m-3}x^{2m-3} + \ldots + c_0x^0$ mod $m_1(x) = c_{2m-2}(x^{2m-2}$ mod $m_1(x)) + c_{2m-3}(x^{2m-3}$ mod $m_1(x)) + \ldots + c_0(x^0$ mod $m_1(\alpha))$, $x^n$ mod $m_1(x)$ (n=0 to 2m–2) is calculated in advance, and each bit is calculated. As for the LUT used to calculate sz, an example is shown in FIG. 10.

2-4 Operation of First Embodiment

Figure 12:
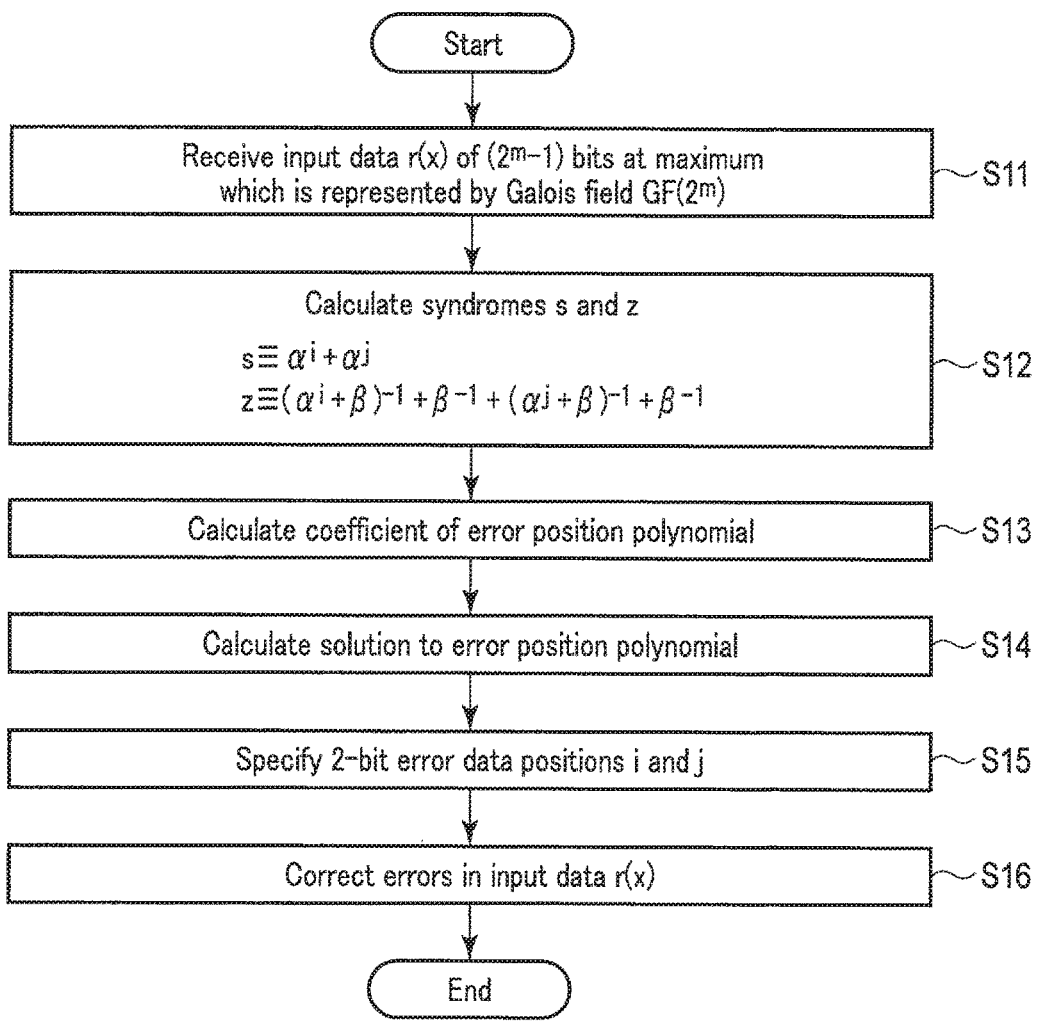
FIG. 12 is a flowchart for explaining the operation of the ECC circuit 14-2 according to the first embodiment.

FIG. 12 is a flowchart for explaining the operation of the ECC circuit 14-2 according to the first embodiment.

As shown in FIG. 12, the ECC circuit 14-2 receives the input data $r(x)$ including data and a parity bit and having a code length n of $(2^m-1)$ bits at maximum which is represented by a Galois field $GF(2^m)$ (step S11).

Next, the syndrome calculation unit 152 calculates the syndromes s and z using tables set to meet $$s = \alpha^i + \alpha^j$$

$$z = (\alpha^1 + \beta)^{-1} + \beta^{-1} + (\alpha^j + \beta)^{-1} + \beta^{-1} \quad (1)$$

where n, m: positive integers $$r(x) = x^{n-1} + \ldots + x + 1$$

e(x): a polynomial representing an error position

α: the nth root of unity that is an element of the Galois field $GF(2^m)$

β: an arbitrary constant of $GF(2^m)$ that is not 0 (β≠α)

$m_1(x)$: a primitive polynomial on GF(2) of α (characteristic representing $m_1(\alpha) = 0$)

i, j: positions where errors of e(x) exist (step S12).

Next, using one multiplier 32, the error position polynomial coefficient calculation unit 153 calculates the multiplication result s*z of the syndromes s and z calculated by the syndrome calculation unit 152 (step S13).

Then, the error position polynomial solution calculation unit 154 calculates the solutions $x_1$ and $x_2$ of the error position polynomial based on the syndrome s*z calculated in step S13 and the syndrome s (step S14).

After that, the decoding unit 36-1 of the error correction unit 155 specifies the 1-bit error data position i based on $x_1$ output from the XOR circuit 34-3. In addition, the decoding unit 36-2 of the error correction unit 155 specifies the 1-bit error data position j based on $x_2$ output from the XOR circuit 34-2 (step S15).

Next, the error bit correction circuit 37 of the error correction unit 155 specifies, by the OR circuit, two error bits at maximum selected by the decoding units 36-1 and 36-2. The specified error bits are inverted, thereby performing error correction (step S16). The input data (x) that has undergone error correction is thus output.

2-5 Effects of First Embodiment

Since the ECC circuit described in the comparative example performs processing at a high speed, a number of exponential-logarithmic LUTs need to be used in the error position polynomial coefficient calculation unit and the like, resulting in an increase in the area. According the ECC circuit 14-2 of the first embodiment, since exponential conversion is unnecessary, use of LUTs can be minimized.

In addition, since the syndrome calculation unit 152 also performs syndrome calculation using tables, syndrome calculation can be performed quickly.

Hence, according to the ECC circuit 14-2 of the first embodiment, reduction of the number of elements and speed-up of processing can be implemented.

3 Second Embodiment

3-1 Outline of Second Embodiment

An ECC circuit 14-3 according to the second embodiment is formed by adding 3-bit detection to the ECC circuit 14-2 according to the first embodiment that performs 2-bit error detection.

In the second embodiment, a 1-bit detection parity is prepared. At the time of write, the total sum (XOR) of the bits of data and a parity=wpc is stored in a memory cell as the detection parity. At the time of read, a total sum rpc of data and a parity and the total sum of the bits of the detection parity wpc are added to obtain a 1-bit signal pc.

If no error exists, since rpc=wpc, pc=rpc+wpc=0. pc=1 indicates that an odd number of errors exist in all data. This is a condition for a 1-bit error or a 3-bit error.

In addition, using a condition given by $$(S+\beta)\cdot(z+\beta^{-1}) = 1 \Leftrightarrow sz + s\beta^{-1} + z\beta = 0 \quad (2)$$

which indicates a 0-bit error or a 1-bit error, conditions pc=1, and $sz + z\beta^{-1} + z\beta \neq 0$ indicate a 3-bit error.

In this system, an error of four or more bits cannot be recognized.

For equation (2), a 2-bit error is assumed first, and the condition of p and q is calculated as $$\Rightarrow (p+q+\beta)\cdot\left(\frac{1}{p+\beta} + \frac{1}{q+\beta} + \beta^{-1}\right) = 1 \Leftrightarrow (p+q)pq = 0 \quad \text{equation (2)}$$

Hence, since p≠q, p=0 or q=0 is the condition. Equation (2) holds only for a 0-bit error or 1-bit error. This also applies to a case in which a 3-bit error is assumed. Since sz is already calculated, and $s\beta^{-1}$ or $z\beta$ are multiplications by a fixed value, the circuit that calculates the condition of equation (2) can be made in a small scale.

These systems can also use a Reed-Solomon (RS) code. They are usable not only for a memory system but also for general error correction.

3-2 Arrangement and Operation

FIG. 13 is a view showing the 3-bit detection ECC circuit 14-3 according to the second embodiment.

As shown in FIG. 13, the ECC circuit 14-3 according to the second embodiment performs data input, syndrome calculation, error position polynomial coefficient calculation, error position polynomial solution calculation, and error correction.

The data input, syndrome calculation, error position polynomial coefficient calculation, and error position polynomial solution calculation are the same as the operations of the first embodiment shown in FIG. 7.

In the second embodiment, as circuits to perform 3-bit detection, multipliers 41-1 and 41-2 that perform fixed value multiplication, an XOR circuit 42, an OR circuit 43, a parity check calculation unit 44, and an AND circuit 45 are provided.

The multiplier 41-1 multiplies a syndrome s calculated by a syndrome calculation unit 152 by $\beta^{-1}$, and outputs $s\beta^{-1}$.

The multiplier 41-2 multiplies a syndrome z calculated by the syndrome calculation unit 152 by β, and outputs zβ.

The XOR circuit 42 calculates the exclusive OR of $s\beta^{-1}$ output from the multiplier 41-1 s*z output from a multiplier 32, and zβ output from the multiplier 41-2, and outputs a calculation result (n bits).

The OR circuit 43 calculates the OR of each bit of the n-bit calculation result output from the XOR circuit 42, and outputs a 1-bit calculation result.

The parity check calculation unit 44 outputs the 1-bit signal pc, as described above.

The AND circuit 45 calculates the AND of the 1-bit calculation result output from the OR circuit 43 and the signal pc output from the parity check calculation unit 44, and outputs a calculation result.

That is, if the calculation result output from the AND circuit 45 is 1, conditions pc=1 and $sz + s\beta^{-1} + z\beta \neq 0$ hold.

An error bit correction circuit 37 performs 3-bit error detection in addition to 2-bit error correction obtained by the syndrome calculation described in the first embodiment.

More specifically, the error bit correction circuit 37 detects a 3-bit error based on the calculation result output from the AND circuit 45.

3-3 Effects of Second Embodiment

According to the ECC circuit 14-3 of the second embodiment, the ECC circuit 14-3 capable of saving the area and detecting a 3-bit error at a high speed, like the ECC circuit 14-2 of the first embodiment, is provided.

4 Modifications

Note that a case in which the ECC circuit 14 according to the embodiments is common to the four banks 11_1 to 11_4 in the storage device 1 has been described above. However, the present invention is not limited to this. For example, the ECC circuit 14 may be provided for each bank. The ECC circuit 14 may be provided in the memory controller 2. The embodiments are applicable not only to a memory system but also to every ECC circuit.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An error check and correction (ECC) circuit comprising:
    a syndrome calculation circuit configured to receive input data r(x) including data and a parity bit and having a code length n of ($2^m-1$) bits at maximum which is represented by a Galois field GF($2^m$), and calculate a syndrome including a term $(p+\beta)^{-1}$ based on the received input data r(x); and
    an error position polynomial coefficient calculation circuit configured to calculate a coefficient of an error position polynomial based on the calculated syndrome,
    where n, m: positive integers
    r(x): a polynomial representing the input data
    p: an indicator representing an error position
    β: an arbitrary constant of GF($2^m$) that is not 0,
    wherein the syndrome calculation circuit calculates syndromes s and z based on the received input data r(x) by performing syndrome calculation to meet $$s=\alpha^i+\alpha^j$$

$$z=(\alpha^i+\beta)^{-1}+\beta^{-1}+(\alpha^j+\beta)^{-1}+\beta^{-1} \quad (A)$$

where:
    α: an nth root of unity that is an element of the Galois field GF($2^m$)
    i, j: positions where errors of e(x) exist
    e(x): a polynomial representing an error position,
    wherein the error position polynomial coefficient calculation circuit calculates the coefficient of the error position polynomial to obtain s×z by multiplying s and z by one multiplier based on the calculated syndromes s and z, wherein the ECC circuit further comprises:
        an error position polynomial solution calculation circuit configured to calculate solutions $x_1$ and $x_2$ to the error position polynomial based on the syndrome s and s×z;
        a decoding circuit configured to specify 2-bit error data positions i and j of the input data based on the solutions $x_1$ and $x_2$; and
        an error bit correction circuit configured to correct errors at the error data positions i and j of the input data based on the specified 2-bit error data positions i and j, and
    wherein the syndrome calculation circuit calculates the syndromes s and z using a table storing a relationship between the input data r(x), the 2-bit error data positions i and j, and the syndromes s and z.

2. The circuit according to claim 1, further comprising:
    an output circuit configured to calculate n bits $sz+s\beta^{-1}+z\beta$ based on the s, z calculated by the syndrome calculation circuit and output a 1 bit output signal which is an exclusive OR of all bits of the calculated n bits $sz+s\beta^{-1}+z\beta$;
    a parity calculation circuit configured to calculate an exclusive OR (rpc) of all bits of the input data and an exclusive OR (wpc) of all bits of write data and output a 1-bit signal (pc); and
    a 3-bit error detection circuit configured to detect a 3 bit error detection based on the 1 bit output signal outputted by the output circuit and the 1 bit signal (pc) outputted by the parity calculation circuit.

3. A storage device comprising:
    a memory; and
    an error check and correction (ECC) circuit configured to receive input data r(x) read from the memory, perform error correction of the received input data, and output, as output data, the input data that has undergone the error correction,
    wherein the input data r(x) includes data and a parity bit and has a code length n of ($2^m-1$) bits at maximum which is represented by a Galois field GF($2^m$),
    wherein the ECC circuit comprises:
        a syndrome calculation circuit configured to calculate a syndrome including a term $(p+\beta)^{-1}$ based on the received input data r(x); and
        an error position polynomial coefficient calculation circuit configured to calculate a coefficient of an error position polynomial based on the calculated syndrome, where n, m: positive integers
    r(x): a polynomial representing the input data
    p: an indicator representing an error position
    β: an arbitrary constant of GF($2^m$) that is not 0,
    wherein the syndrome calculation circuit calculates syndromes s and z based on the received input data r(x) by performing syndrome calculation to meet $$s=\alpha^i+\alpha^j$$

$$z=(\alpha^i+\beta)^{-1}+\beta^{-1}+(\alpha^j+\beta)^{-1}+\beta^{-1} \quad (A)$$

where:
    α: an nth root of unity that is an element of the Galois field GF($2^m$)
    i, j: positions where errors of e(x) exist
    e(x): a polynomial representing an error position,
    wherein the error position polynomial coefficient calculation circuit calculates the coefficient of the error position polynomial to obtain s×z by multiplying s and z by one multiplier based on the calculated syndromes s and z, wherein the ECC circuit further comprises:
an error position polynomial solution calculation circuit configured to calculate solutions $x_1$ and $x_2$ to the error position polynomial based on the syndrome s and s×z;
a decoding circuit configured to specify 2-bit error data positions i and j of the input data based on the solutions $x_1$ and $x_2$; and
an error bit correction circuit configured to correct errors at the error data positions i and j of the input data based on the specified 2-bit error data positions i and j, and wherein the syndrome calculation circuit calculates the syndromes s and z using a table storing a relationship between the input data r(x), the 2-bit error data positions i and j, and the syndromes s and z.

4. The device according to claim 3, further comprising:
an output circuit configured to calculate n bits $sz+s\beta^{-1}+z\beta$ based on the s, z calculated by the syndrome calculation circuit and output a 1 bit output signal which is an exclusive OR of all bits of the calculated n bits $sz+s\beta^{-1}+z\beta$;
a parity calculation circuit configured to calculate an exclusive OR (rpc) of all bits of the input data and an exclusive OR (wpc) of all bits of write data and output a 1-bit signal (pc); and
a 3-bit error detection circuit configured to detect a 3 bit error detection based on the 1 bit output signal outputted by the output circuit and the 1 bit signal (pc) outputted by the parity calculation circuit.

5. A memory system comprising:
a memory; and
a memory controller including an error check and correction (ECC) circuit configured to receive input data r(x) read from the memory, perform error correction of the received input data, and output, as output data, the input data that has undergone the error correction,
wherein the input data r(x) includes data and a parity bit and has a code length n of $(2^m-1)$ bits at maximum which is represented by a Galois field $GF(2^m)$,
wherein the ECC circuit comprises:
a syndrome calculation circuit configured to calculate a syndrome including a term $(p+\beta)^{-1}$ based on the received input data r(x); and
an error position polynomial coefficient calculation circuit configured to calculate a coefficient of an error position polynomial based on the calculated syndrome, where n, m: positive integers
r(x): a polynomial representing the input data
p: an indicator representing an error position
$\beta$: an arbitrary constant of GF(2m) that is not 0,
wherein the syndrome calculation circuit calculates syndromes s and z based on the received input data r(x) by performing syndrome calculation to meet $s \equiv \alpha^i + \alpha^j$ $z \equiv (\alpha^i+\beta)^{-1}+\beta^{-1}+(\alpha^j+\beta)^{-1}+\beta^{-1}$ \hfill (A)

where:
$\alpha$: an nth root of unity that is an element of the Galois field $GF(2^m)$
i, j: positions where errors of e(x) exist
e(x): a polynomial representing an error position,
wherein the error position polynomial coefficient calculation circuit calculates the coefficient of the error position polynomial to obtain s×z by multiplying s and z by one multiplier based on the calculated syndromes s and z, and
wherein the ECC circuit further comprises:
an error position polynomial solution calculation circuit configured to calculate solutions $x_1$ and $x_2$ to the error position polynomial based on the syndrome s and s×z;
a decoding circuit configured to specify 2-bit error data positions i and j of the input data based on the solutions $x_1$ and $x_2$; and
an error bit correction circuit configured to correct errors at the error data positions i and j of the input data based on the specified 2-bit error data positions i and j, and
wherein the syndrome calculation circuit calculates the syndromes s and z using a table storing a relationship between the input data r(x), the 2-bit error data positions i and j, and the syndromes s and z.

6. The system according to claim 5, further comprising:
a circuit configured to calculate n bits $sz+s\beta^{-1}+z\beta$ based on the s, z calculated by the syndrome calculation circuit and output a 1 bit output signal which is an exclusive OR of all bits of the calculated n bits $sz+s\beta^{-1}+z\beta$;
a parity calculation circuit configured to calculate an exclusive OR (rpc) of all bits of the input data and an exclusive OR (wpc) of all bits of write data and output a 1-bit signal (pc); and
a 3-bit error detection circuit configured to detect a 3 bit error detection based on the 1 bit output signal outputted by the output circuit and the 1 bit signal (pc) outputted by the parity calculation circuit.

\* \* \* \* \*